(12) United States Patent
Kyung et al.

(10) Patent No.: US 7,668,026 B2
(45) Date of Patent: Feb. 23, 2010

(54) DATA I/O LINE CONTROL CIRCUIT AND SEMICONDUCTOR INTEGRATED CIRCUIT HAVING THE SAME

(75) Inventors: Ki Myung Kyung, Ichon (KR); Jeong Tae Hwang, Ichon (KR)

(73) Assignee: Hynix Semiconductor Inc. (KR)

( * ) Notice: Subject to any disclaimer, the term of this patent is extended or adjusted under 35 U.S.C. 154(b) by 42 days.

(21) Appl. No.: 11/962,046

(22) Filed: Dec. 20, 2007

(65) Prior Publication Data

US 2008/0304340 A1 Dec. 11, 2008

(30) Foreign Application Priority Data

Jun. 11, 2007 (KR) .................. 10-2007-0056939

(51) Int. Cl.
*G11C 7/00* (2006.01)
*G11C 8/00* (2006.01)

(52) U.S. Cl. ............... 365/194; 365/190; 365/191; 365/230.03; 365/230.06

(58) Field of Classification Search ........... 365/191, 365/194
See application file for complete search history.

(56) References Cited

U.S. PATENT DOCUMENTS

| | | | | |
|---|---|---|---|---|
| 5,923,605 A | * | 7/1999 | Mueller et al. ......... | 365/230.03 |
| 5,930,194 A | * | 7/1999 | Yamagata et al. ...... | 365/230.03 |
| 6,064,622 A | * | 5/2000 | Lee et al. .............. | 365/230.06 |
| 6,067,271 A | * | 5/2000 | Isa ....................... | 365/230.03 |
| 6,188,631 B1 | * | 2/2001 | Lee et al. .............. | 365/230.03 |
| 6,301,169 B1 | * | 10/2001 | Kikuda et al. ......... | 365/201 |
| 6,304,509 B1 | * | 10/2001 | Hirobe et al. ......... | 365/230.03 |
| 6,353,574 B1 | | 3/2002 | Shim | |
| 6,359,803 B1 | * | 3/2002 | Tanaka .................. | 365/63 |
| 6,449,198 B1 | | 9/2002 | Hamade et al. | |
| 6,850,444 B2 | | 2/2005 | Cho | |
| 6,870,205 B2 | * | 3/2005 | Lee et al. .............. | 257/202 |
| 6,906,972 B2 | * | 6/2005 | Proell et al. ........... | 365/203 |
| 7,064,993 B2 | * | 6/2006 | Gyohten et al. ........ | 365/189.18 |
| 7,248,517 B2 | * | 7/2007 | Lee et al. .............. | 365/203 |
| 7,266,037 B2 | * | 9/2007 | Mochida ............... | 365/230.03 |
| 7,289,385 B2 | * | 10/2007 | Kwak .................... | 365/230.03 |
| 2003/0103368 A1 | * | 6/2003 | Arimoto et al. ......... | 365/63 |
| 2006/0028888 A1 | * | 2/2006 | Shin et al. .............. | 365/205 |

FOREIGN PATENT DOCUMENTS

| | | |
|---|---|---|
| JP | 2000036195 | 2/2000 |
| JP | 2005-310345 | 4/2005 |
| JP | 2006-114192 | 4/2006 |
| KR | 1020070073027 A | 7/2007 |

* cited by examiner

*Primary Examiner*—Son L Mai
(74) *Attorney, Agent, or Firm*—Baker & McKenzie LLP

(57) ABSTRACT

A data I/O line control circuit includes a control unit for outputting a control signal after a predetermined time from an activation of a column select signal, and a switching unit for selectively separating a pair of first sub-middle I/O lines, which is coupled to a pair of local I/O lines located at one side of the switching unit, from a pair of second sub-middle I/O lines, which is coupled to both the pair of the local I/O lines and a data bus sense amplifier located at the other side of the switching unit.

23 Claims, 10 Drawing Sheets

DATA I/O LINE CONTROL CIRCUIT AND SEMICONDUCTOR INTEGRATED CIRCUIT HAVING THE SAME

CROSS-REFERENCES TO RELATED APPLICATION

This application claims the benefit under 35 U.S.C. 119(a) of Korean Patent Application No. 10-2007-0056939, filed on Jun. 11, 2007 in the Korean Intellectual Property Office, the disclosure of which is incorporated herein by reference in its entirety as if set forth in full.

BACKGROUND

1. Technical Field

The embodiments described herein relate to a semiconductor integrated circuit and, more particularly, to a data I/O line control circuit and a semiconductor integrated circuit having the same.

2. Related Art

Referring to FIG. 1, a conventional semiconductor integrated circuit includes a memory cell 110, a sense amplifier 120 to sense and amplify data from the memory cell 110, a column select transistor 130 to transfer the data loaded on a pair of bit lines BL and BLB to a pair of local I/O lines LIO and LIOB, an I/O switching unit 140 to transfer the data loaded on the pair of local I/O lines LIO and LIOB to a pair of middle I/O lines MIO and MIOB, and a data sense amplifier 150 to transfer the data loaded on the pair of middle I/O lines MIO and MIOB to a pair of global I/O lines GIO and GIOB.

One word line WL1 of a plurality of word lines in a bank is activated by an active command. Data which are stored in a cell (FIG. 1 illustrates one of a plurality of cells in the bank) to be connected to the word line WL1 are loaded on the pair of the bit lines BL and BLB through a charge sharing operation and thereafter the sense amplifier 120 senses and amplifies the loaded data on the pair of the bit lines BL and BLB. The data loaded on the pair of the bit lines BL and BLB, which is associated with a corresponding column address, of a plurality of bit line pairs connected to the word line WL1 are outputted based on a read command. Subsequently, a column select signal (YS) is activated and the data loaded on the pair of the bit lines BL and BLB are transferred to the pair of the local I/O lines LIO and LIOB. The data loaded on the pair of the local I/O lines LIO and LIOB are transferred to the pair of the middle I/O lines MIO and MIOB, and the data loaded on the pair of the middle I/O lines MIO and MIOB are inputted into the data bus sense amplifier 150 for the sense amplifying operation.

According to the conventional memory device, when the column select signal (YS) is activated, the charge sharing operations are conducted between the pairs of the local I/O lines LIO and LIOB, the middle I/O lines MIO and MIOB and the bit lines BL and BLB. When the potential levels of the local I/O lines LIO and LIOB, the middle I/O lines MIO and MIOB and the bit lines BL and BLB are in a core voltage Vcore (at this time, the bar lines LIOB, MIOB and BLB of the local I/O line LIO, the middle I/O line MIO and the bit line BL are in a ground voltage level), there is no problem. However, when the potential levels of the local I/O line LIO and the middle I/O line MIO are in the core voltage Vcore and the potential level of the bit line BL is in the ground voltage level and when the charges flow into the bit line BL from the local and middle I/O lines LIO and MIO, the potential level of the bit line BL is bounced, that is, a voltage bouncing is caused on the bit line BL.

Referring to FIG. 2, which is a wave form diagram of the semiconductor memory device of FIG. 1, at an active mode, the potential level of the pair of the bit lines BL and BLB is amplified by the sense amplifier 120 and then the bit lines BL and BLB are respectively amplified to the core voltage level and the ground voltage level from a starting voltage level of the precharge voltage level. The wave form "S1" is taken by a normal operation of the pair of the bit lines BL and BLB. Referring to the wave form of S1, during a section in which the column select signal (YS) is activated, the potential level of the bit line BL rises from the ground voltage level and drops to the ground voltage level due to an influence of the potential level of the local I/O line LIO and the middle I/O line MIO. This voltage bouncing of the bit lines does not cause a problem because the normal wave form of the potential level is obtained by a latch operation of the sense amplifier 120; however, in some cases, when such a voltage bouncing is abnormally big, an abnormal voltage bouncing (A in FIG. 2), in which the potential levels of the bit lines BL and BLB are changed as shown in the wave form "S2", may be caused because of the instant charge flowing from the local I/O line and the middle I/O line MIO.

SUMMARY

The disclosure herein is directed to providing a data I/O line control circuit capable of reducing a voltage bouncing of bit lines and much less having an influence of the voltage bouncing and a semiconductor integrated circuit having the same.

According to one aspect, a data I/O line control circuit can comprise a control unit configured to output a control signal after a predetermined time from an activation of a column select signal, and a switching unit configured to selectively separate a pair of middle I/O lines respectively in response to the control signal.

According to another aspect, a data I/O line control circuit can comprise a control unit configured to output a control signal after a predetermined time from an activation of a column select signal, and a switching unit configured to selectively separate a pair of first sub-middle I/O lines, which can be coupled to a pair of local I/O lines which can be located at one side of the switching unit, from a pair of second sub-middle I/O lines, which are coupled to both the pair of the local I/O lines and a data bus sense amplifier located at the other side of the switching unit.

According to still another aspect, a semiconductor integrated circuit comprises an I/O switching unit configured to transfers data loaded on a pair of local I/O lines to a pair of middle I/O lines, a control unit configured to output a control signal after a predetermined time from an activation of a column select signal, a switching unit configured to selectively connect a pair of first sub-middle I/O lines to a pair of second sub-middle I/O lines in response to the control signal, and a data bus sense amplifier configured to amplify the data loaded on the pair of the second sub-middle I/O lines and transfer the data to a pair of global I/O lines, wherein the pair of the middle I/O lines can be divided into the pair of the first sub-middle I/O lines, which can be connected to the pair of the local I/O lines located at one side of the switching unit, and the pair of the second sub-middle I/O lines, which can be connected to both the pair of the local I/O lines located at the other side of the switching unit and the data bus sense amplifier.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
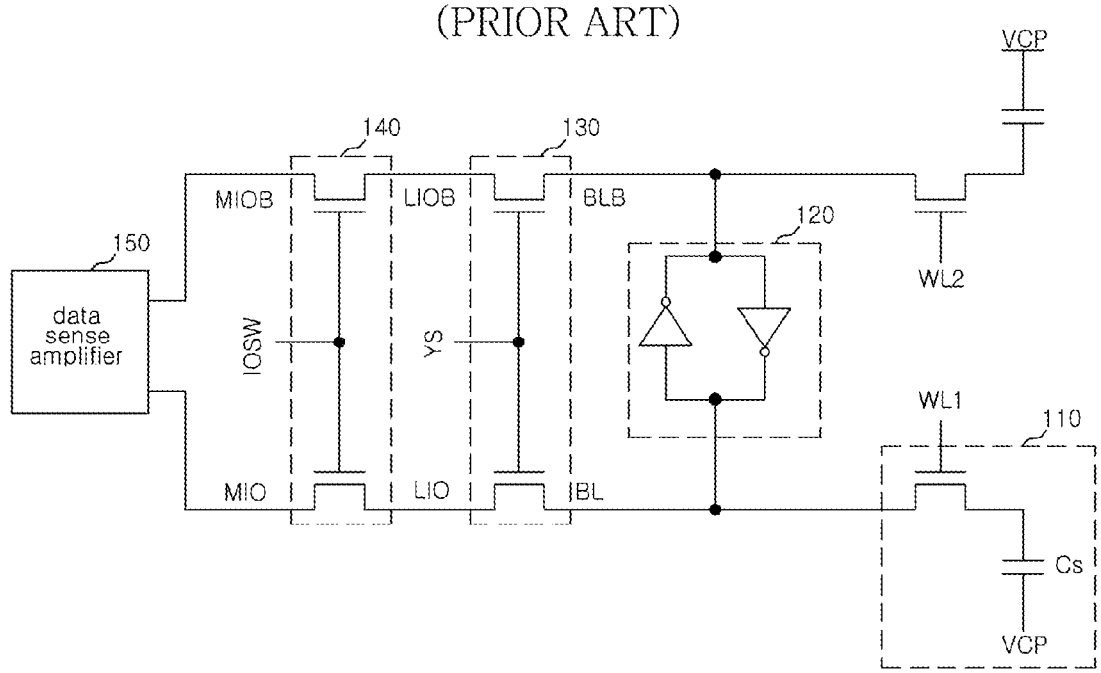
FIG. 1 is a schematic diagram illustrating an exemplary semiconductor integrated circuit.
Figure 2:
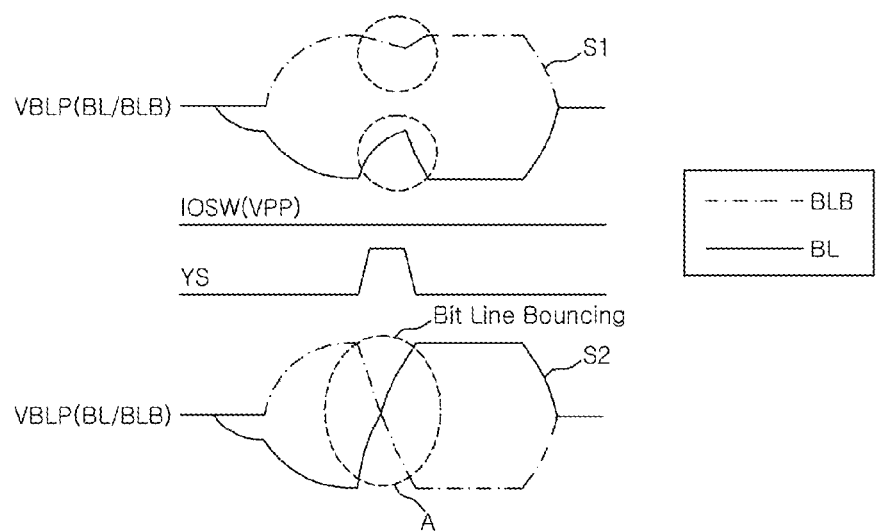
FIG. 2 is a wave form diagram illustrating voltage levels of bit lines in the semiconductor integrated circuit of FIG. 1.
Figure 3:
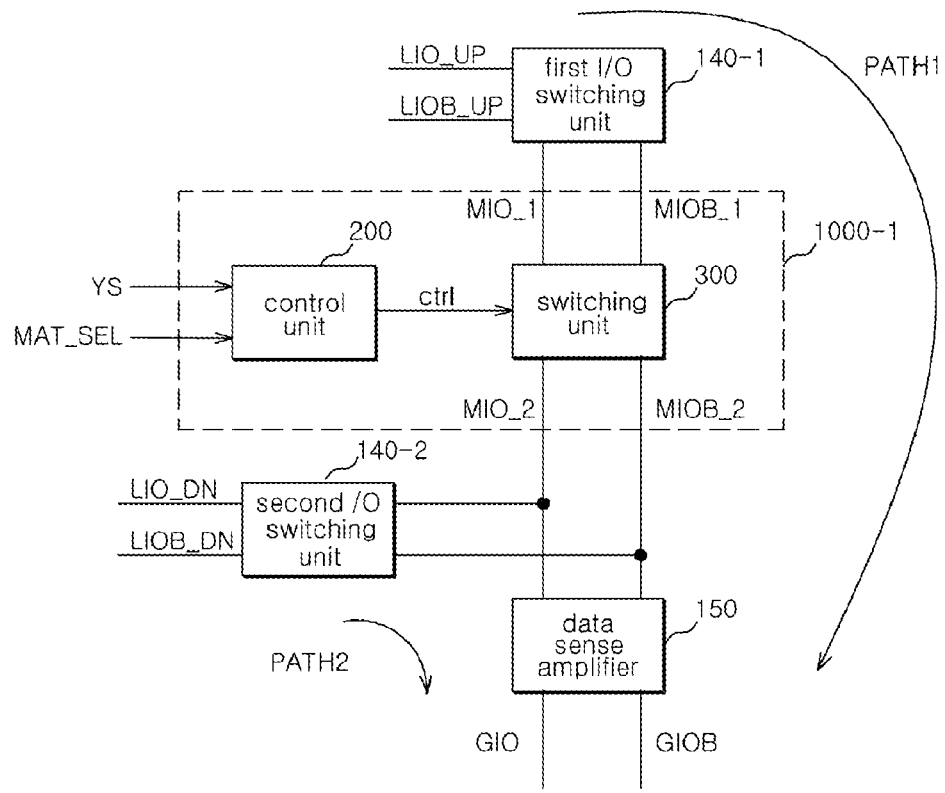
FIG. 3 is a schematic diagram illustrating a semiconductor integrated circuit having a data I/O control circuit according to one embodiment.

FIG. 3 is a schematic diagram illustrating a semiconductor integrated circuit having a data I/O control circuit according to one embodiment. Referring to FIG. 3, the data I/O control circuit can include a control unit 200, a switching unit 300, an I/O switching unit 140 (including first and second I/O switching units 140-1 and 140-2), and a data bus sense amplifier 150.

The first I/O switching units 140-1 can transfer data, which can be loaded on a pair of bit lines LIO_UP and LIOB_UP, to a pair of first sub-middle I/O lines MIO_1 and MIOB_1, which can be located at one side of the switching unit 300. For example, the one side of the switching unit 300 can be an upper region of a bank and the other side thereof can be a lower region of the bank.

The second I/O switching units 140-2 can transfer data, which can be loaded on a pair of bit lines LIO_DN and LIOB_DN, to a pair of second sub-middle I/O lines MIO_2 and MIOB_2, which can be located at the other side of the switching unit 300.

The first and second I/O switching units 140-1 and 140-2 can be typical I/O switches or sense amplifiers, which can be configured to couple a pair of local I/O lines LIO and LIOB to a pair of middle I/O lines MIO and MIOB. For convenience in illustration, the pair of the first sub-middle I/O lines MIO_1 and MIOB_1 are defined as one part of the middle I/O lines MIO and MIOB and the pair of the second sub-middle I/O lines MIO_2 and MIOB_2 are defined as the other part of the middle I/O lines MIO and MIOB when an I/O line (the middle I/O lines MIO and MIOB) of a semiconductor integrated circuit are divided into two parts.

The middle I/O lines MIO and MIOB can be disposed in a middle of a pair of data transfers lines configured to transfer the data loaded on a pair of local I/O lines LIO and LIOB to a pair of global I/O lines GIO and GIOB. Accordingly, the pairs of the first and second sub-middle I/O lines MIO_1, MIOB_1 MIO_2 and MIOB_2, which are defined by dividing the middle I/O lines MIO and MIOB, can also transfer the data loaded on the pair of local I/O lines to the pair of global I/O lines. The second sub-middle I/O lines MIO_2 and MIOB_2 can be a pair of I/O lines that are relatively close to the data bus sense amplifier 150, and the first sub-middle I/O lines MIO_1 and MIOB_1 are a pair of I/O lines that are relatively far from the data bus sense amplifier 150 as compared with the second sub-middle I/O lines MIO_2 and MIOB_2. That is, the pair of the first sub-middle I/O lines MIO_1 and MIOB_1 can be separated from the pair of the second sub-middle I/O lines MIO_2 and MIOB_2 centered on the switching unit 300.

The data bus sense amplifier 150 can amplify the data loaded on the pair of the second sub-middle I/O line MIO_2 and MIOB_2 and transfer the amplified data to the pair of the global I/O lines GIO and GIOB. The data bus sense amplifier 150 can be implemented by a typical I/O sense amplifier.

The control unit 200 can produce a control signal (ctrl), which can be activated after a predetermined time from an activation of a column select signal (YS) and can be deactivated in response to a deactivation of a mat select signal (MAT_SEL).

The mat select signal (MAT_SEL) can be a signal that can have a high or low level according to a selection from two side-located mats, which can be respectively disposed at one side and the other side of the switching unit 300. In one embodiment, the cell mat can have a plurality of cells configured in a cell array shown in FIG. 7. Further, the bank can have a plurality of cell mats. That is, the mat select signal (MAT_SEL) can be in a high level when the data in the cell mat at one side of the bank are read out and the mat select signal (MAT_SEL) can be in a low level when the data in the cell mat at the other side of the bank are read out. The mat select signal (MAT_SEL) can be produced by combining address signals having mat information.

For convenience in illustration, one embodiment is described herein in which the mat select signal (MAT_SEL) is activated at a high level when one of the cell mats at one side of the bank is enabled and the mat select signal (MAT_SEL) is activated at a low level when one of the cell mats at the other side of the bank is enabled. However, the mat select signal (MAT_SEL) and the activation and deactivation thereof can be available to other configurations of the opposite logic levels.

The column select signal (YS) can be a gate input signal of a column select transistor to function as an I/O switch to transfer or block a data transmission from the pair of the bit lines BL and BLB to the pair of the local I/O lines LIO and LIOB when the data stored in the memory cell are output to an external circuit in a specific mode. Accordingly, when the column select signal (YS) is activated, the column select transistor can be turned on and the data loaded on the pair of the bit lines BL and BLB can be transferred to the pair of local I/O lines LIO and LIOB.

It can take a predetermined time to transfer the data loaded on the pair of the local I/O lines LIO and LIOB to the pair of the middle I/O lines MIO and MIOB (the pair of the first sub-middle I/O lines MIO_1 and MIOB_1 or the pair of the second sub-middle I/O lines MIO_2 and MIOB_2) and this time can be set to a degree that can be correspondent to a delay time required to activate the control signal (ctrl) based on the activation of the column select signal (YS). The switching unit 300 can be configured to electrically separate the pairs of the middle I/O line MIO_1 MIOB_1, MIO_2 and MIOB_2 in response to the control signal (ctrl). More particularly, the switching unit 300 can electrically separate the pair of the second sub-middle I/O lines MIO_2 and MIOB_2 from the pair of the first sub-middle I/O lines MIO_1 and MIOB_1 in response to the control signal (ctrl) and electrically connect them. When the control signal (ctrl) is activated, the switching unit 300 can connect the pair of the first sub-middle I/O lines MIO_1 and MIOB_1 to the pair of the second sub-middle I/O lines MIO_2 and MIOB_2, and when the control signal (ctrl) is deactivated, the switching unit 300 can separate the pair of first sub-middle I/O lines MIO_1 and MIOB_1 from the pair of second sub-middle I/O lines MIO_2 and MIOB_2.

The switching unit 300 can be implemented by a switch that can be turned on/off in response to the control signal (ctrl). For example, an active element, such as an NMOS transistor, a PMOS transistor and a pass gate, can be employed as the switching unit 300.

Figure 4:
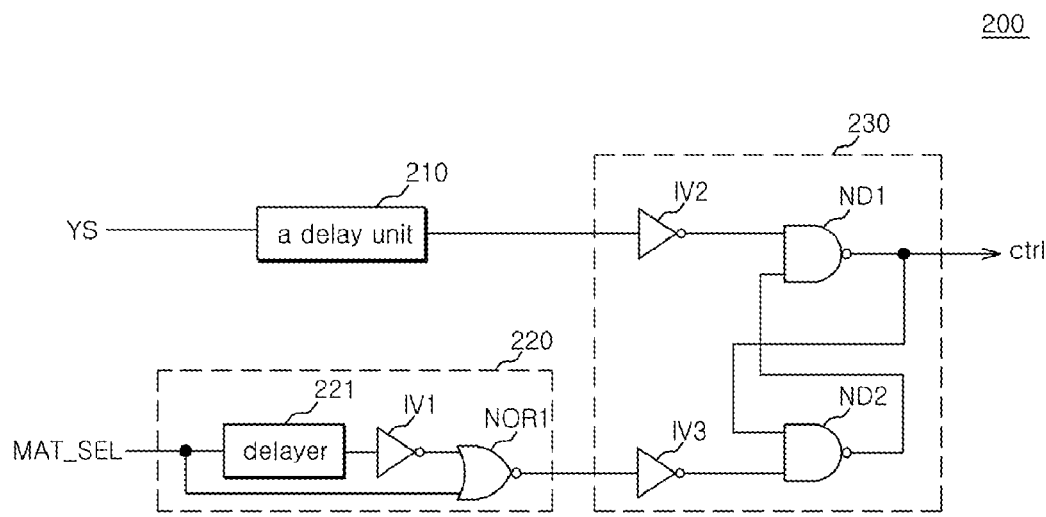
FIG. 4 is a detailed circuit diagram illustrating a control unit that can be included in the circuit illustrated in FIG. 3.

FIG. 4 is a detailed circuit diagram illustrating a control unit that can be included in the circuit illustrated in FIG. 3. As shown in FIG. 4, the control unit 200 can include a delay unit 210, a pulse generating unit 220 and a latch unit 230. The delay unit 210 can be configured to delay the input column select signal (YS) for a predetermined time. The delay unit 210 can be a conventional delay circuit. For example, the delay unit 210 can be implemented by resistors, capacitors, serially connected inverters, or some combination thereof. In addition, the delay unit 210 can have a resistor within the serially connected inverters. The delay time can be determined by the number of inverters and/or a resistance value.

The pulse generating unit 220 can receive the mat select signal (MAT_SEL) and then output a pulse signal. The pulse generating unit 220 can include a delayer 221, a first inverter IV1 and a first NOR gate NOR1. The delayer 221 can receive the mat select signal (MAT_SEL) and then output a delayed signal. The first NOR gate NOR1 can receive an inverted signal output of the delayer 221 and the mat select signal (MAT_SEL). A conventional pulse generator can be used for the pulse generating unit 220.

The latch unit 230 can receive the output signal of the delay unit 210 and the pulse signal from the pulse generating unit 220 and output the control signal (ctrl) by latching these signals. The latch unit 230 can include second and third inverters IV2 and IV3 and first and second NAND gates ND1 and ND2. The second inverter IV2 can invert the output signal of the delay unit 210. The third inverter IV3 can invert the pulse signal (from the pulse generating unit 220). The first and second NAND gates ND1 and ND2 can receive the output signals of the second and third inverters IV2 and IV3, respectively, and can be cross-coupled to each other with a feedback operation.

Figure 5:
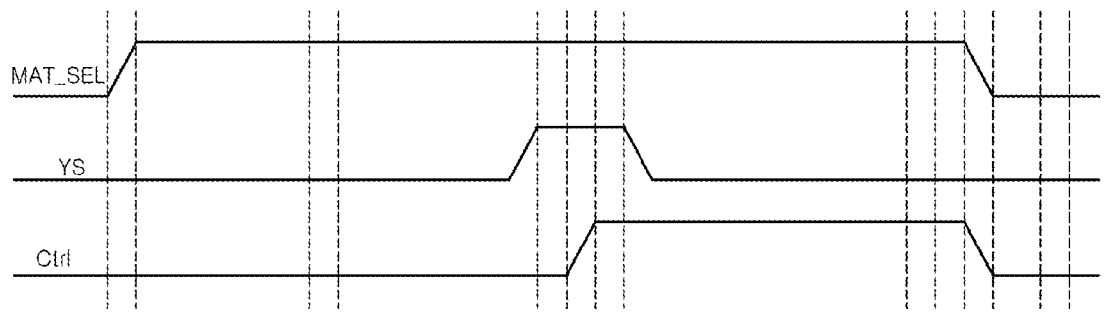
FIG. 5 is a wave form diagram illustrating an operation of the control unit that can be included in the circuit illustrated in FIG. 4.

FIG. 5 is a wave form diagram illustrating an operation of the control unit that can be included in the circuit illustrated in FIG. 4. Referring to FIG. 5, when the mat select signal (MAT_SEL) is in a high level and the column select signal (YS) is in a low level, the control signal (ctrl), which is the output signal of the control unit 200 is in a low level. Thereafter, the control signal (ctrl) can transition from a low level to a high level after a predetermined time from the transition time in which the column select signal (YS) goes from a low level to a high level. Also, the control signal (ctrl) can transition to a low level when the mat select signal (MAT_SEL) goes to a low level.

Figure 6:
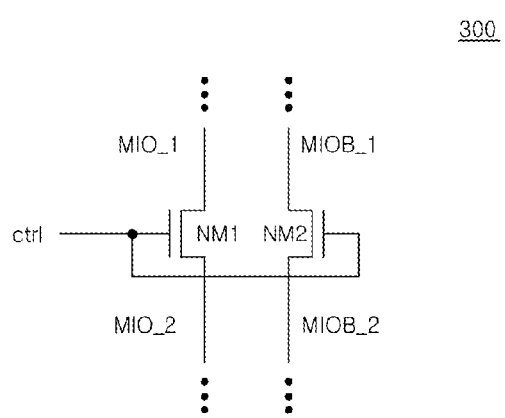
FIG. 6 is a detailed circuit diagram illustrating a switching unit that can be included in the circuit illustrated in FIG. 4.

FIG. 6 is a detailed circuit diagram illustrating a switching unit that can be included in the circuit illustrated in FIG. 4. As shown in FIG. 6, the switching unit 300 can be implemented by NMOS transistors NM1 and NM2. The NMOS transistors NM1 and NM2 can electrically connect the pair of the first sub-middle I/O lines MIO_1/MIOB_1 to the pair of the second sub-middle I/O lines MIO_2/MIOB_2 or electrically separate the pair of the first sub-middle I/O lines MIO_1 and MIOB_1 from the pair of the second sub-middle I/O lines MIO_2 and MIOB_2. When the control signal (ctrl) is activated, the NMOS transistors NM1 and NM2 can electrically connect the pair of the first sub-middle I/O lines MIO_1 and MIOB_1 to the pair of the second sub-middle I/O lines MIO_2 and MIOB_2. When the control signal (ctrl) is deactivated, the NMOS transistors NM1 and NM2 can electrically separate the pair of the first sub-middle I/O lines MIO_1 and MIOB_1 from the pair of the second sub-middle I/O lines MIO_2 and MIOB_2.

Figure 7:
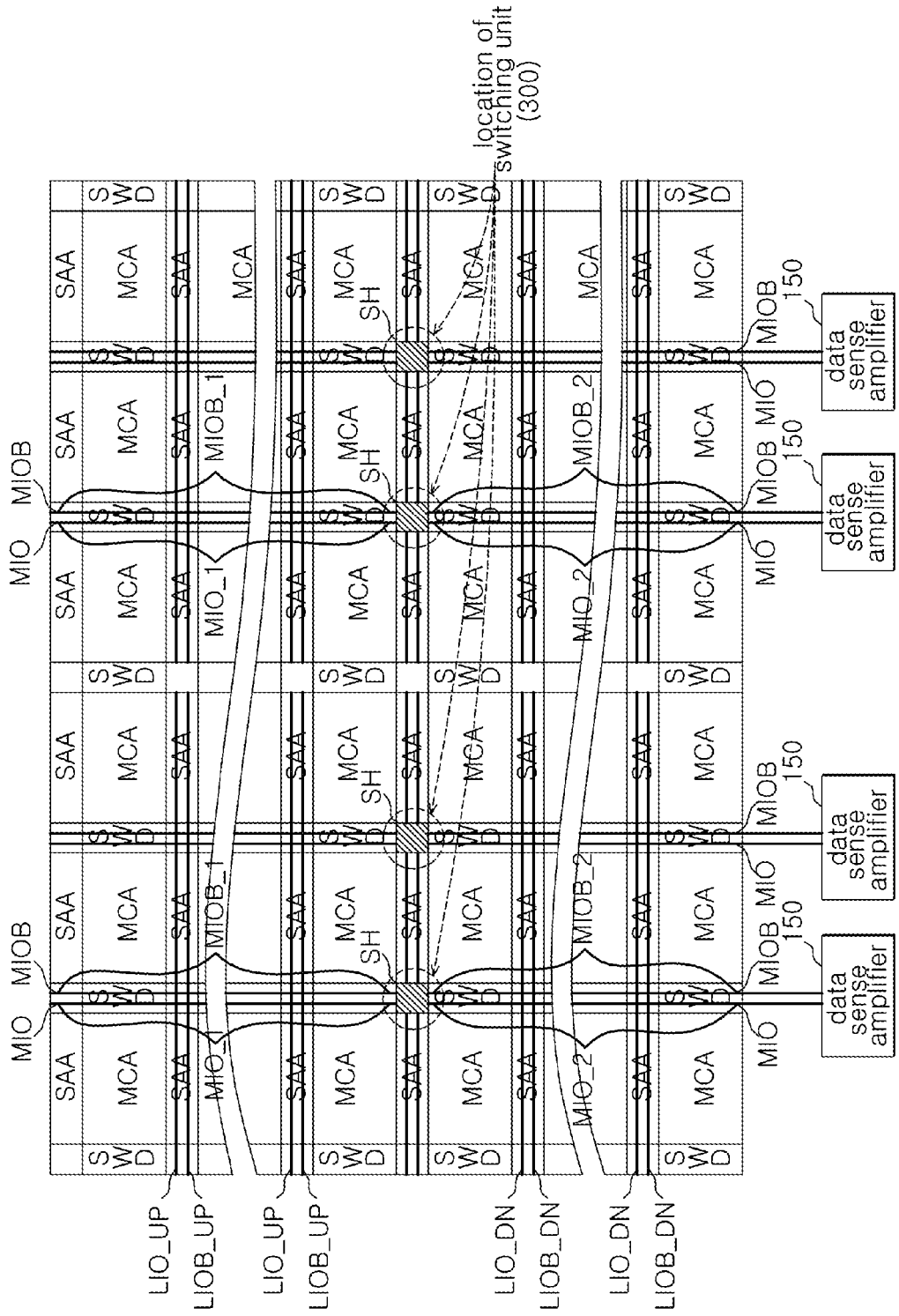
FIG. 7 is a schematic diagram illustrating the semiconductor integrated circuit that can be included in the circuit illustrated in FIG. 3.

FIG. 7 is a schematic diagram illustrating the semiconductor integrated circuit that can be included in the circuit illustrated in FIG. 3. Referring to FIG. 7, the semiconductor integrated circuit according to one embodiment can include a cell array MCA, a sense amplifier array SAA, a sub-word line driver SWD, a sub hole region SH, two pairs of the local I/O lines LIO_UP, LIOB_UP, LIO_DN and LIOB_DN, a pair of the first sub-middle I/O lines MIO_1 and MIOB_1 a pair of the second sub-middle I/O lines MIO_2 and MIOB_2 and the switching unit 300.

The cell array MCA can have a plurality of memory cells. The sense amplifier array SAA can sense and amplify a voltage difference between the pair of the bit lines BL and BLB which can transfer the data from the memory cells. The sub-word line driver SWD can drive a word line which can transfer the data stored in the memory cell to one of the bit lines BL and BLB or block such a data transmission toward the bit line. The sub hole region SH can be disposed at the point of intersection between the sense amplifier array SAA and the sub-word line driver SWD. The pair of the local I/O lines LIO and LIOB can receive the data loaded on the pair of the bit lines BL and BLB. The pair of the first sub-middle I/O lines MIO_1 and MIOB_1 and the pair of the second sub-middle I/O lines MIO_2 and MIOB_2 can respectively receive the data loaded on the pair of the local I/O lines LIO and LIOB. The pair of the first sub-middle I/O lines MIO_1 and MIOB_1, the pair of the second sub-middle I/O lines MIO_2 and MIOB_2 and the switching unit 300 can be disposed in a region of the sub hole region SH such that the switching unit 300 connects the pair of the first sub-middle I/O lines MIO_1 and MIOB_1 to the pair of the second sub-middle I/O lines MIO_2 and MIOB_2 or electrically separate the pair of the first sub-middle I/O lines MIO_1 and MIOB_1 from the pair of the second sub-middle I/O lines MIO_2 and MIOB_2.

The pair of the first sub-middle I/O lines MIO_1 and MIOB_1 can be coupled to the pair of the local I/O lines LIO_UP and LIOB_UP, which can be located at one side of the switching unit 300. The pair of the second sub-middle I/O lines MIO_2 and MIOB_2 can be coupled to the pair of the local I/O lines LIO_DN and LIOB_DN, which can be located at the other side of the switching unit 300. The switching unit 300 can be disposed within the sub hole region SH (area defined by the symbol "/" (or slash) in FIG. 7).

Accordingly, as shown in FIG. 7, the semiconductor integrated circuit can include one switching unit 300 per every pair of the middle I/O lines MIO and MIOB. That is, the switching unit 300, which is a connecting element to connect the pair of the first sub-middle I/O lines MIO_1 and MIOB_1 to the pair of the second sub-middle I/O lines MIO_2 and MIOB_2, can be provided for the semiconductor integrated circuit per every pair of middle I/O lines in the bank.

The number of the switching units 300, which can be provided for the bank of the semiconductor integrated circuit, corresponds to the number of the pairs of the middle I/O lines MIO and MIOB. Therefore, the area increased by the switching unit 300 has no problem because the increased area not significant.

Preferably, as shown in FIG. 7, the switching unit 300 can be disposed in the sub hole region SH. Particularly, the switching unit 300 can be disposed in the sub hole region SH, which is positioned in the middle of the connection region between the pair of the first sub-middle I/O lines MIO_1 and MIOB_1 and the pair of the second sub-middle I/O lines MIO_2 and MIOB_2. However, it is possible to dispose the switching unit 300 in other regions within the bank, regardless of the middle position of the bank.

The operation of the semiconductor integrated circuit having the data I/O line control circuit 1000-1 according one embodiment will be described herein with reference to FIGS. 3 to 7.

When the data stored in a cell in the mat are read out, the mat select signal (MAT_SEL) can be activated and the control signal (ctrl) can be in a low level at the time the column select signal (YS) is activated. Accordingly, the switching unit 300 can be turned off so that the pair of the first sub-middle I/O lines MIO_1 and MIOB_1 is separated from the pair of the second sub-middle I/O lines MIO_2 and MIOB_2. At a read operation, the total capacitance of the pair of bit lines BL and BLB, which can be connected to the pair of the local I/O lines LIO_UP and LIOB_UP can be created by only the capacitance of the pair of the first sub-middle I/O lines MIO_1 and MIOB_1 to the exclusion of the capacitance of the pair of the second sub-middle I/O lines MIO_2 and MIOB_2. In the conventional semiconductor integrated circuit, the pair of bit lines BL and BLB can be influenced not only by the capacitance of the pair of the first sub-middle I/O lines MIO_1 and MIOB_1 but also by the capacitance of the pair of the second sub-middle I/O lines MIO_2 and MIOB_2. In one embodiment, the pair of the bit lines BL and BLB is influenced by only the capacitance of the pair of the first sub-middle I/O lines MIO_1 and MIOB_1. If the pair of the first sub-middle I/O lines MIO_1 and MIOB_1 has the same capacitance as the pair of the second sub-middle I/O lines MIO_2 and MIOB_2 the influence of the capacitance on the pair of the middle I/O lines MIO and MIOB, is one half of the total capacitance in a conventional semiconductor integrated circuit. As a result, the pair of the bit lines BL and BLB according to one embodiment is less influenced by the charges, which come from both the pair of the local I/O lines LIO and LIOB and the pair of the middle I/O lines MIO and MIOB, thereby reducing the bit line bouncing. In case the capacitance of the pair of the middle I/O lines MIO and MIOB is reduced, an influence of the pair of the middle I/O lines MIO and MIOB on the pair of the bit lines BL and BLB is weak, and thus the pair of the bit lines BL and BLB is not sensitive to the voltage level of the pair of the middle I/O lines MIO and MIOB.

Accordingly, since the pair of bit lines BL and BLB is less influenced by the charges from the pair of the middle I/O lines MIO and MIOB, a normal data signal can be transferred to the pair of the local I/O lines LIO_UP and LIOB_UP. Thereafter, since the control signal (ctrl) is activated after a predetermined time from an activation of the column select signal (YS), the switching unit 300 can connect the pair of the first sub-middle I/O lines MIO_1 and MIOB_1 to the pair of the second sub-middle I/O lines MIO_2 and MIOB_2. The data loaded from the pair of the local I/O lines LIO_UP and LIOB_UP are transferred to the pair of the second sub-middle I/O lines MIO_2 and MIOB_2 through the pair of the first sub-middle I/O lines MIO_1 and MIOB_1. Subsequently, the data transferred to the pair of the second sub-middle I/O lines MIO_2 and MIOB_2 can be continuously transferred to the data bus sense amplifier 150. When the data in the mat, which can be disposed at one side of the bank, are read out, the data can be transferred via a signal path PATH1 in FIG. 3.

The signal path PATH1, which can be used to read out the data in the mat, will be described in detail below.

The first I/O switching unit 140-1 can transfer the data loaded on the pair of the local I/O lines LIO_UP and LIOB_UP to the pair of the first sub-middle I/O lines MIO_1 and MIOB_1. When the switching unit 300 is turned on by the control unit 200, the data applied to the pair of the first sub-middle I/O lines MIO_1 and MIOB_1 can be loaded on the pair of the second sub-middle I/O lines MIO_2 and MIOB_2. Thereafter, the data applied to the pair of the second sub-middle I/O lines MIO_2 and MIOB_2 can be transferred to the pair of the global I/O lines GIO and GIOB through the data bus sense amplifier 150.

When the data is read out from the mat, which can be disposed at the other side of the bank, the mat select signal (MAT_SEL) can be in a low level. Since the control signal (ctrl) is always in a low level regardless of the column select signal (YS), the switching unit 300 can electrically separate the pair of the first sub-middle I/O lines MIO_1 and MIOB_1 from the pair of the second sub-middle I/O lines MIO_2 and MIOB_2. The total capacitance of the pair of the bit lines BL and BLB, which can be connected to the pair of the local bit line LIO_DN and LIOB_DN at the data read operation, can be created by the partial capacitance of the pair of the second sub-middle I/O lines MIO_2 and MIOB_2 because the capacitance of the pair of the first sub-middle I/O lines MIO_1 and MIOB_1 does not influence the pair of the bit lines BL and BLB (because the switching unit 300 is turned off and the pair of the local I/O lines LIO_DN and LIOB_DN is connected to the pair of the second sub-middle I/O lines MIO_2 and MIOB_2).

Similar to the data read operation in which the data are read out from the mat, which is disposed at one side of the bank, when the data read operation in which the data read out from the mat, which is disposed at the other side of the bank is carried out, the influence of the capacitance of the pair of the middle I/O lines MIO and MIOB on the pair of the bit line BL and BLB, in one embodiment, can be one half of the total capacitance in the conventional semiconductor integrated circuit because the pair of the first sub-middle I/O lines MIO_1 and MIOB_1 can have the same capacitance as the pair of the second sub-middle I/O lines MIO_2 and MIOB_2. As a result, the pair of the bit lines BL and BLB according one embodiment described herein is less influenced by the charges, which come from both the pair of the local I/O lines LIO and LIOB and the pair of the middle I/O lines MIO and MIOB, thereby reducing the bit line bouncing.

Accordingly, a normal data signal can be transferred to the pair of the local I/O lines LIO_DN and LIOB_DN. The data loaded on the pair of the local I/O lines LIO_DN and LIOB_DN can be transferred to the pair of the second sub-middle I/O lines MIO_2 and MIOB_2. Subsequently, the data transferred to the pair of the second sub-middle I/O lines MIO_2 and MIOB_2 can be continuously transferred to the data bus sense amplifier 150. When the data are read out from the mat, which can be disposed at the other side of the bank, the data can be transferred along a signal path PATH2 in FIG. 3.

The signal path PATH2 to read out the data from the mat will be described in detail below.

The second I/O switching unit 140-2 can transfer the data loaded on the pair of the local I/O lines LIO_DN and LIOB_DN to the pair of the second sub-middle I/O lines MIO_2 and MIOB_2. The data, which are applied to the pair of the second sub-middle I/O lines MIO_2 and MIOB_2, can be transferred to the pair of the global I/O lines GIO and GIOB through the data bus sense amplifier 150 regardless of the control unit 200 and the switching unit 300.

A semiconductor integrated circuit having a data I/O control circuit according to another embodiment will be described in detail below. For convenience in illustration, the same reference numerals denote the same elements in various embodiments and the same reference numerals are also adapted to make it easy to understand the configuration in other embodiments.

Figure 8:
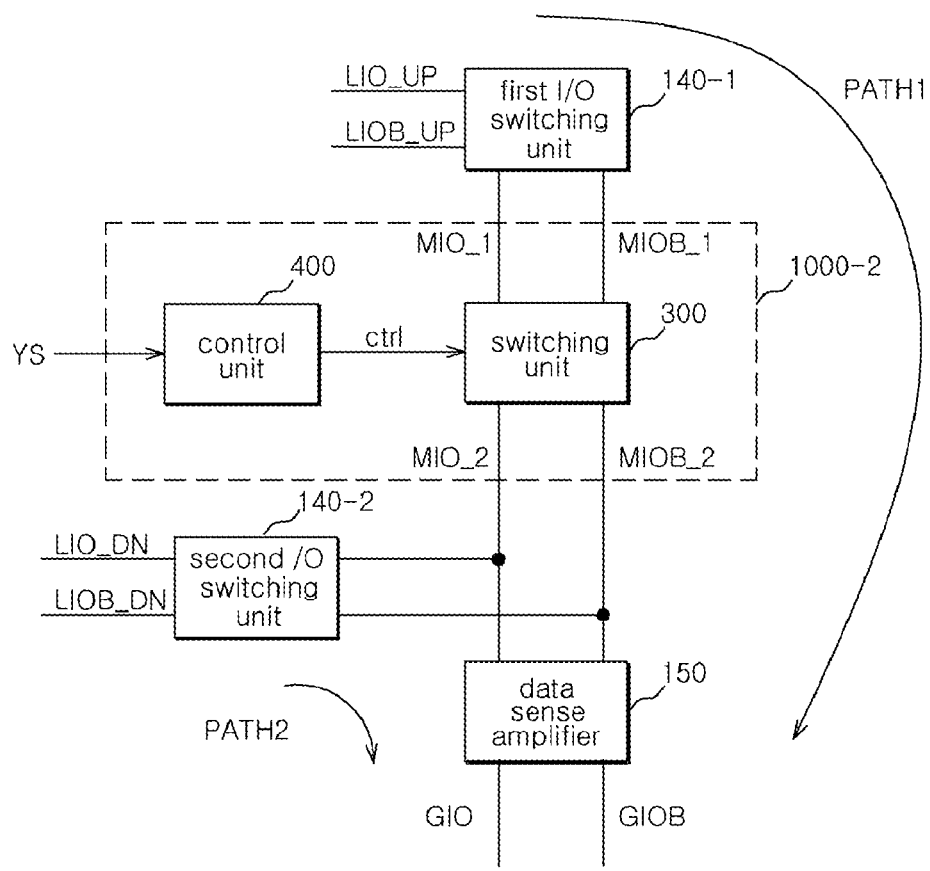
FIG. 8 is a schematic diagram illustrating a semiconductor integrated circuit having a data I/O control circuit according to another embodiment.

FIG. 8 is a schematic diagram illustrating a semiconductor integrated circuit having a data I/O control circuit according to another embodiment. Referring to FIG. 8, the semiconductor integrated circuit having a data I/O control circuit, according to one embodiment, can include a control unit 400, a switching unit 300, an I/O switching unit 140 (including first and second I/O switching units 140-1 and 140-2), and a data bus sense amplifier 150. As compared with the configuration of FIG. 3, the semiconductor integrated circuit of FIG. 8 has the same elements shown in FIG. 3 except the control unit 400.

The control unit 400 can produce a control signal (ctrl), which can be activated after a predetermined time from the activation of a column select signal (YS).

Figure 9:
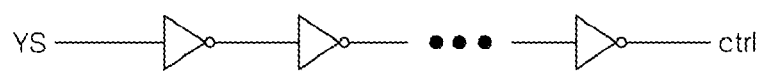
FIG. 9 is a detailed circuit diagram illustrating a control unit that can be included in the circuit illustrated in FIG. 8.

FIG. 9 is a detailed circuit diagram illustrating a control unit that can be included in the circuit illustrated in FIG. 8. Referring to FIG. 9, the control unit 400 can be implemented by a circuit configured to receive and delays the column select signal (YS). The control unit 400 can include a plurality of inverters, which can be connected in series to each other in even numbers. Accordingly, the control unit 400 can output the control signal (ctrl) with the lapse of a predetermined time after the column select signal is input.

Figure 10:
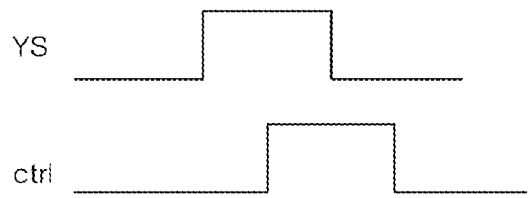
FIG. 10 is a wave form diagram illustrating an operation of the control unit that can be included in the circuit illustrated in FIG. 9.

Referring to FIG. 10, the control signal (ctrl) can be in a low level when the column select signal (YS) is activated and the control signal (ctrl) is in a high level after a predetermined time.

One difference between the control unit 200 of FIG. 4 and the control unit 400 of FIG. 9 is that the control signal (ctrl) of the control unit 200 can be produced based on both the column select signal (YS) and the mat select signal (MAT_SEL). However, the control signal (ctrl) of the control unit 400 is produced based on only the column select signal (YS).

The control unit 400 of FIG. 9 can output the control signal (ctrl) after the predetermined time from the activation of the column select signal (YS), regardless of the mat select signal (MAT_SEL), even though any one of cells is selected from the mats. On the contrary, the control unit 200 of FIG. 4 can output the control signal (ctrl), which can be activated after the predetermined time from the activation of the column select signal (YS), when a cell is selected from the mat disposed at one side thereof, but outputs the deactivated control signal (ctrl), regardless of the voltage level of the column select signal (YS), when a cell is selected from the mat disposed at the other side thereof.

Accordingly, in case the data I/O lines are controlled by the control unit 400 of FIG. 9, the bit lines, which are correspondent to the local I/O lines LIO_DN and LIOB_DN, are not influenced by the capacitance of the first sub-middle I/O lines MIO_1 and MIOB_1 after a predetermined time from the activation of the column select signal (YS), when a cell is selected from the mat disposed at the other side thereof. On the contrary, in case the data I/O lines are controlled by the control unit 200 of FIG. 4, the bit lines are not influenced by the capacitance of the first sub-middle I/O lines MIO_1 and MIOB_1 regardless of the timing of the column select signal (YS), when a cell is selected from the mat disposed at the other side thereof.

Figure 11:
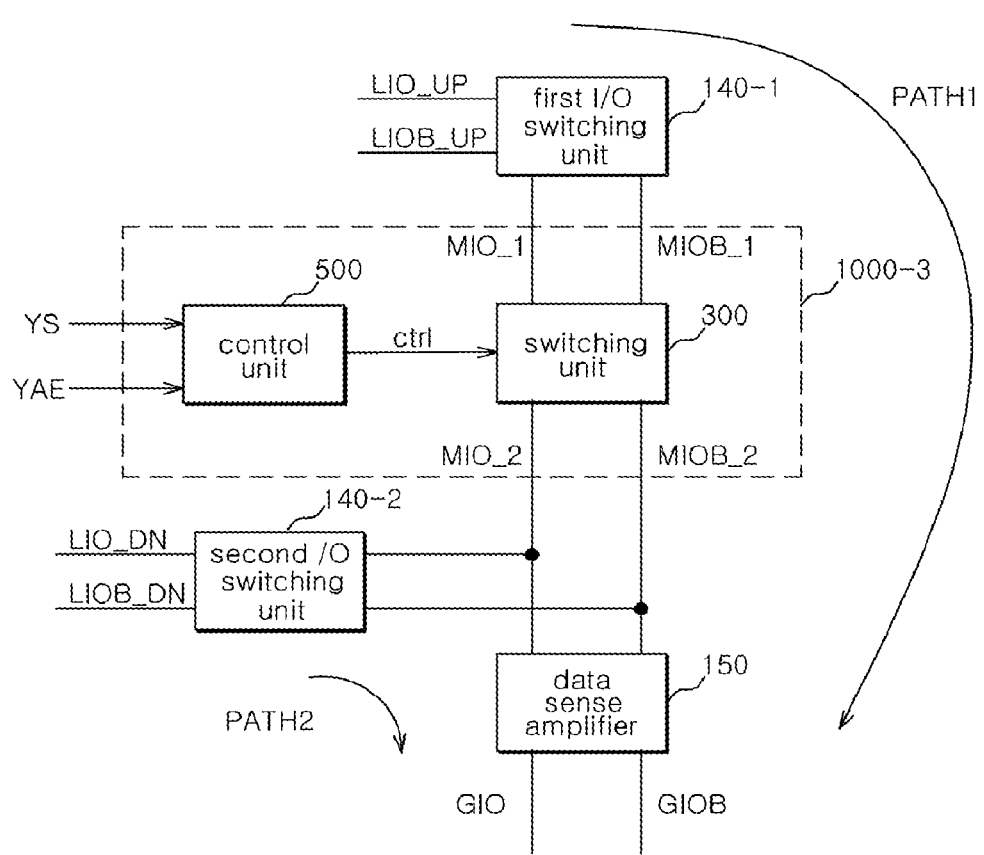
FIG. 11 is a schematic diagram illustrating a semiconductor integrated circuit having a data I/O control circuit according to still another embodiment.

Referring to FIG. 11, a semiconductor integrated circuit according to still another embodiment can include a control unit 500, a switching unit 300, an I/O switching unit 140 (including a first I/O switching unit 140-1 and a second I/O switching unit 140-2), and a data bus sense amplifier 150.

As compared with the configuration of FIG. 3, the semiconductor integrated circuit of FIG. 11 can have the same elements shown in FIG. 3, and the control unit 500.

The control unit 500 can produce a control signal (ctrl), which can be deactivated after a first predetermined time from an activation of a column address enable signal (YAE) and activated after a second predetermined time from the activation of the column select signal (YS).

The column address enable signal (YAE) is a signal, which can be activated at the read operation and leads the column select signal (YS). The first predetermined time can be set to a time required to transfer the data from the pair of bit lines BL and BLB to the pair of the local I/O lines LIO and LIOB. Also, the range of the second predetermined time can be set to a time required to transfer the data from the local I/O lines LIO and LIOB to the pair of the middle I/O lines MIO and MIOB (the pair of the first and second sub-middle I/O lines MIO_1 and MIOB_1 and MIO_2 and MIOB_2).

Since the control signal (ctrl) is activated, the switching unit 300 can electrically connect the pair of the first sub-middle I/O lines MIO_1 and MIOB_1 to the pair of the second sub-middle I/O lines MIO_2 and MIOB_2. Thereafter, at the read operation, since the control unit 500 can output a deactivated control signal (ctrl) when the column address enable signal (YAE) is activated, the switching unit 300 can separate the pair of the first sub-middle I/O lines MIO_1 and MIOB_1 from the pair of the second sub-middle I/O lines MIO_2 and MIOB_2. At this time, the data loaded on the pair of the bit lines BL and BLB can be loaded to the pair of the local I/O lines LIO and LIOB such that the capacitance of the pair of the middle I/O lines MIO and MIOB, which influences the pair of the bit lines BL and BLB, is reduced. Next, the control unit 500 can produce the activated control signal (ctrl) after the second predetermined time from the column select signal (YS), which can be indicative of the time in which the data loaded on the pair of the bit lines BL and BLB are loaded to the pair of the local and middle I/O lines MIO and MIOB. Accordingly, the switching unit 300 can connect the pair of the first sub-middle I/O lines MIO_1 and MIOB_1 to the pair of the second sub-middle I/O lines MIO_2 and MIOB_2 and perform the data transmission.

Therefore, the pair of the first sub-middle I/O lines MIO_1 and MIOB_1 are connected to the pair of the second sub-middle I/O lines MIO_2 and MIOB_2 and they can be shortly separated from each other at the time the data loaded on the pair of the bit lines BL and BLB are loaded to the pair of the local I/O lines LIO and LIOB during the read operation and, thereafter, they can be connected to each other. By doing so, the influence of capacitance, which is caused by the pair of the local I/O lines LIO and LIOB and the pair of the middle I/O lines MIO and MIOB, can be reduced.

Figure 12:
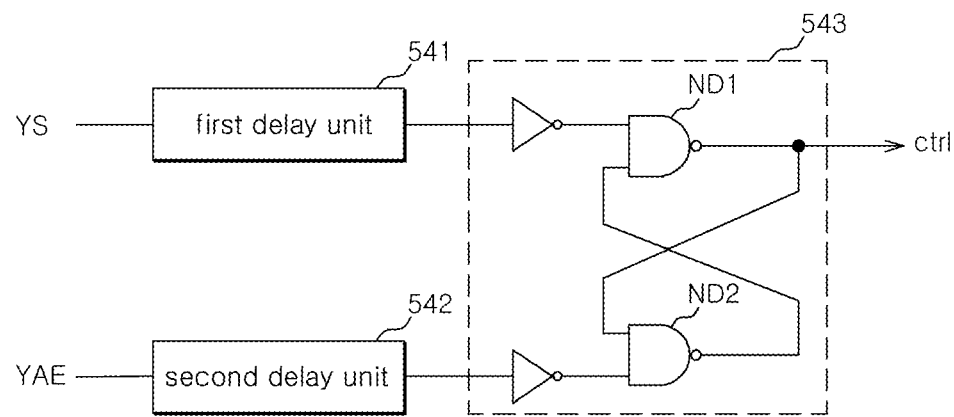
FIG. 12 is a detailed circuit diagram illustrating a control unit that can be included in the circuit illustrated in FIG. 11.

FIG. 12 is a detailed circuit diagram illustrating a control unit that can be included in the circuit illustrated in FIG. 11. Referring to FIG. 12, the control unit 500 of FIG. 11 can be implemented by a first delay unit 541, a second delay unit 542 and a latch unit 543.

The first delay unit 541 can receive the column select signal (YS) and then delay it for the first predetermined time and the second delay unit 542 can receive the column address enable signal (YAE) and then delay it for the second predetermined time. The latch unit 543 can receive output signals of the first and second delay units 541 and 543 and latch the received signals to produce the control signal (ctrl).

Figure 13:
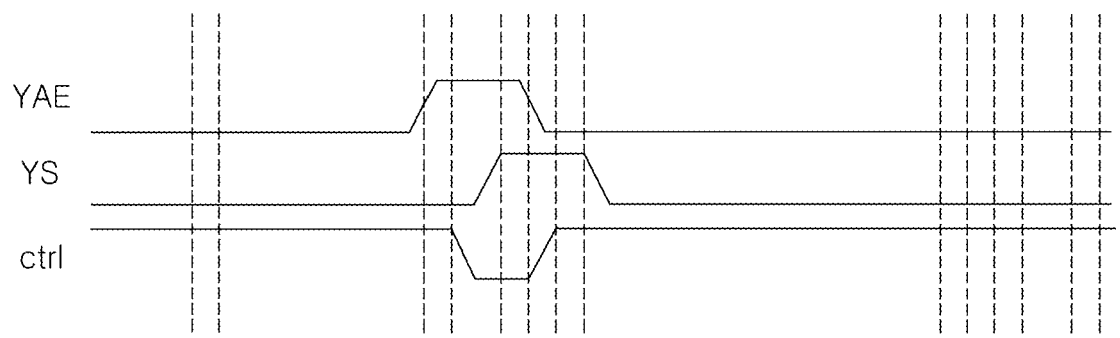
FIG. 13 is a wave form diagram illustrating an operation of the control unit that can be included in the circuit illustrated in FIG. 12.

FIG. 13 is a wave form diagram illustrating an operation of the control unit that can be included in the circuit illustrated in FIG. 12. Referring to FIG. 13, the control signal (ctrl), which is activated in a high level, can transition to a low level after the first predetermined time if the column address enable signal (YAE) is activated to a high level. Thereafter, the control signal (ctrl) can transition to a high level after the second predetermined time in response to the activation of the column select signal (YS).

Figure 14:
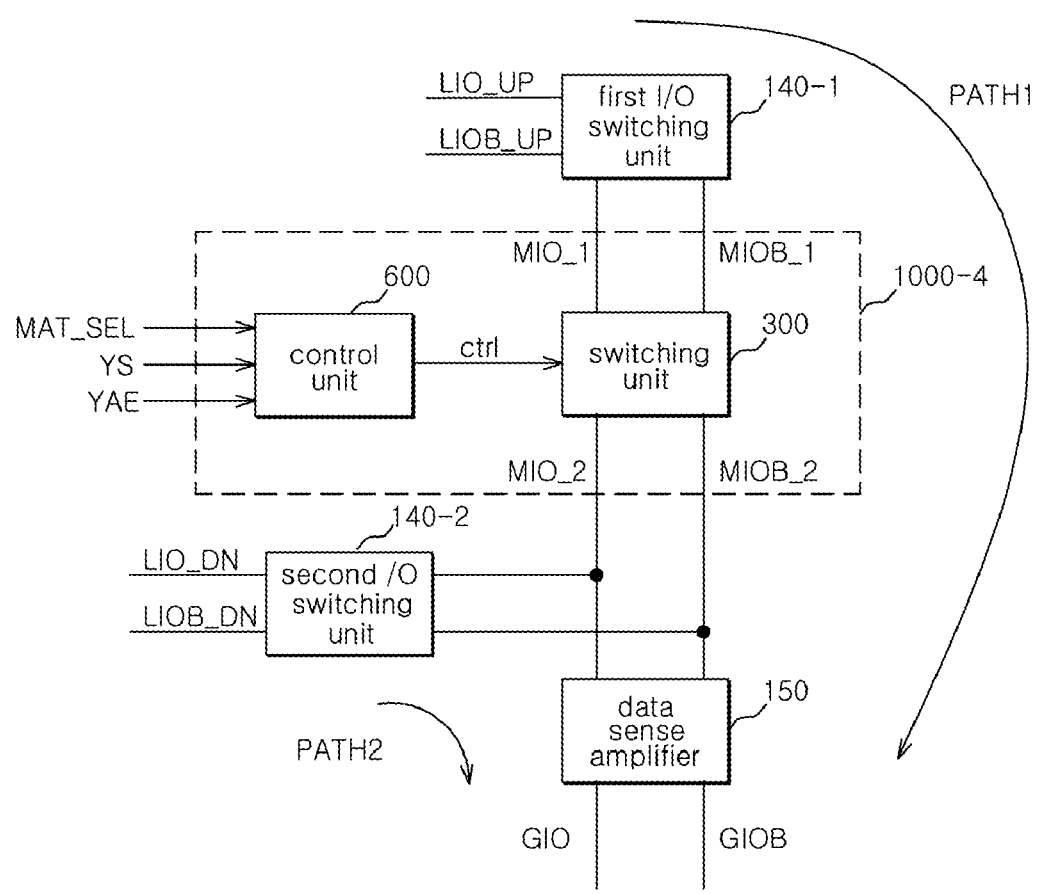
FIG. 14 is a schematic diagram illustrating a semiconductor integrated circuit having a data I/O control circuit according to still yet another embodiment.

FIG. 14 is a schematic diagram illustrating a semiconductor integrated circuit having a data I/O control circuit according to still yet another embodiment Referring to FIG. 14, the semiconductor integrated circuit having a data I/O control circuit according to still another embodiment can include a control unit 600, a switching unit 300, an I/O switching unit 140 (including first and second I/O switching units 140-1 and 140-2), and a data bus sense amplifier 150.

As compared with the configuration of FIG. 3, the semiconductor integrated circuit of FIG. 14 can have the same elements shown in FIG. 3 and the control unit 600.

The control unit 600 can be enabled according to the activation of the mat select signal (MAT_SEL) and disabled after a first predetermined time from the activation of the column address enable signal (YAE). Accordingly, as the column select signal (YS) is activated, the control unit 600 can be enabled after a second predetermined time, and as the mat select signal (MAT_SEL) is deactivated, the control unit 600 can output the deactivated control signal (ctrl).

That is, the control unit 600 of FIG. 14 can output the activated control signal (ctrl) according to the activation of the mat select signal (MAT_SEL). At the read operation, the control unit 600 can output the deactivated control signal (ctrl) when the column address enable signal (YAE) is activated. Thereafter, the control unit 600 can be enabled after the second predetermined time according to the activation of the column select signal (YS) and output the control signal (ctrl) according to the deactivation of the mat select signal (MAT_SEL).

Figure 15:
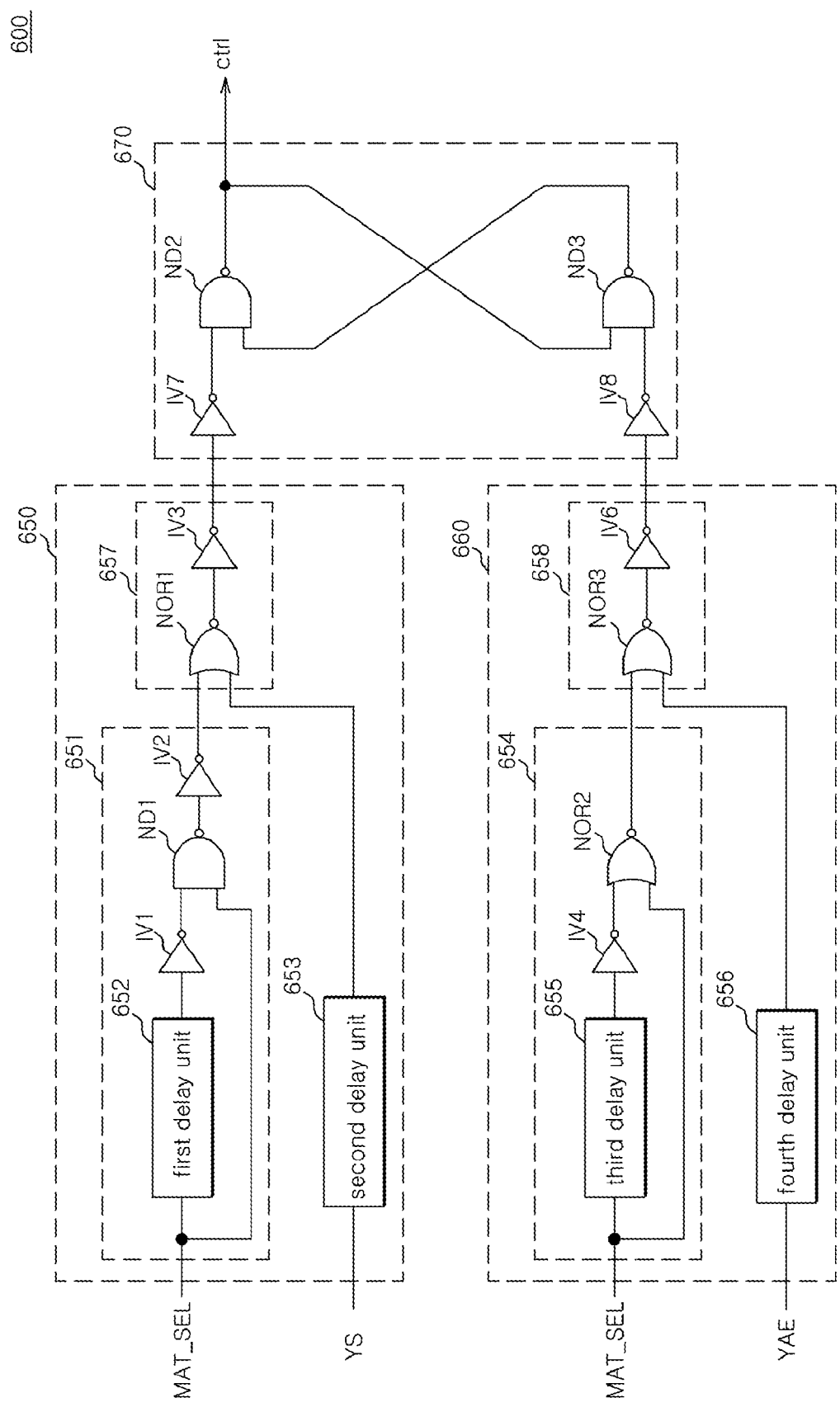
FIG. 15 is a detailed circuit diagram illustrating a control unit that can be included in the circuit illustrated in FIG. 14.

FIG. 15 is a detailed circuit diagram illustrating a control unit that can be included in the circuit illustrated in FIG. 14. As shown in FIG. 15, the control unit 600 can include a set pulse generating unit 650, a reset pulse generating unit 660 and a latch unit 670.

The set pulse generating unit 650 can include a first pulse generating unit 651 having a first delay unit 652, a second delay unit 653 and a first logic circuit 657. The first pulse generating unit 651 can receive the mat select signal (MAT_SEL) and then output a first pulse. The second delay unit 653 can receive the column select signal (YS) and delay it for the first predetermined time. The first logic circuit 657 can include a NOR gate NOR1 and an inverter IV3.

The reset pulse generating unit 660 can include a second pulse generating unit 654 having a third delay unit 655, a fourth delay unit 656 and a second logic circuit 658. The second pulse generating unit 654 can receive the mat select signal (MAT_SEL) and then output a second pulse. The fourth delay unit 656 can receive the column address enable signal (YAE) and delay it for the second predetermined time. The first logic circuit 658 can include a NOR gate NOR3 and an inverter IV6.

The latch unit 670 can latch output signals of the set pulse generating unit 650 and the reset pulse generating unit 660 in order to produce the control signal (ctrl).

Figure 16:
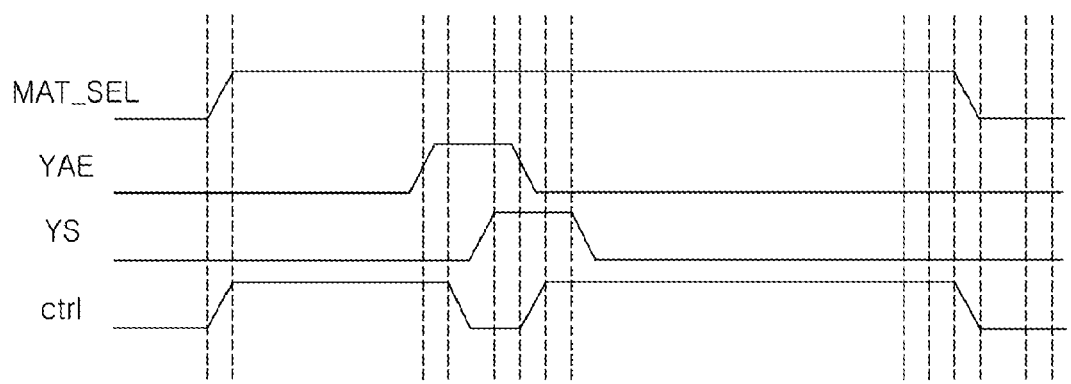
FIG. 16 is a wave form diagram illustrating an operation of the control unit that can be included in the circuit illustrated in FIG. 15.

FIG. 16 is a wave form diagram illustrating an operation of the control unit that can be included in the circuit illustrated in FIG. 15. Referring to FIG. 16, the control signal (ctrl) can maintain the activation state based on the activation of the mat select signal (MAT_SEL) and the control signal (ctrl) goes to a low level after the first delay time from the activation of the column address enable signal (YAE). Thereafter, the control signal (ctrl) can transition to a high level after the second delay time from the activation of the column select signal (YS). Finally, the control signal (ctrl) can transition to a low level when the mat select signal (MAT_SEL) is deactivated.

The present embodiments can be applied to all the data I/O lines as well as the middle I/O lines. For example, the embodiments can be applied to the local I/O lines, the middle I/O lines, and the global I/O lines.

Further, a precharge circuit can be included in the embodiments described herein. The precharge circuit can be connected to both the pair of the first sub-middle I/O lines MIO_1 and MIOB_1 and the pair of the second sub-middle I/O lines MIO_2 and MIOB_2 being disposed in the sub hole region for precharging the pair of the middle I/O lines. Therefore, two pairs of the middle I/O lines (that is, the first and second sub-middle I/O lines MIO_1 MIOB_1 MIO_2 and MIOB_2) can be simultaneously precharged by one precharge circuit, which can reduce the number of the precharge circuits without an abnormal operation. Preferably, in case that the precharge circuit is disposed in the sub hole region at which the switching unit 300 is also disposed, both the pair of the first sub-middle I/O lines MIO_1 and MIOB_1 and the pair of the second sub-middle I/O lines MIO_2 and MIOB_2 can be connected to the precharge circuit with relatively short transmission lines.

Also, each of the first sub-middle I/O lines MIO_1 and MIOB_1 and the second sub-middle I/O lines MIO_2 and MIOB_2 can be precharged by individually providing a precharge circuit for each of them.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data I/O line control circuit comprising:
   a control unit configured to output a control signal after a predetermined time from an activation of a column select signal; and a switching unit coupled to the control unit, the switching unit configured to selectively separate a pair of middle I/O lines in response to the control signal.

2. The data I/O line control circuit of claim 1, wherein the pair of the middle I/O lines are divided into a pair of first sub-middle I/O lines and a pair of second sub-middle I/O lines, wherein the pair of the first sub-middle I/O lines is one of the two divided pairs and are transmission lines, which are coupled to a pair of local I/O lines located at one side of the switching unit, and wherein the pair of the second sub-middle I/O lines are the other of the two divided pairs and are transmission lines, which are coupled to both the pair of the local I/O lines and a data bus sense amplifier located at the other side of the switching unit.

3. The data I/O line control circuit of claim 2, wherein the control unit is further configured to deactivate the control signal in response to a deactivation of a mat select signal.

4. The data I/O line control circuit of claim 3, wherein the control unit is further configured to output the control signal after a predetermined time from the activation of the column select signal when data loaded on a pair of local I/O lines, which are located at one side of the switching unit, are read out, and wherein the control unit is further configured to output the control signal, which is always deactivated, when the data loaded on the pair of the local I/O lines, which are located at the other side of the switching unit, are read out.

5. The data I/O line control circuit of claim 3, wherein the control unit comprises:
a delay unit configured to delay the column select signal for the predetermined time;
a pulse generating unit configured to generate a pulse signal using the mat select signal; and
a latch unit coupled to the delay unit and the pulse generating unit configured to latch an output signal of the delay unit and the pulse signal in order to produce the control signal.

6. The data I/O line control circuit of claim 3, wherein the switching unit is further configured to separate the pair of the first sub-middle I/O lines from the pair of the second sub-middle I/O lines when both the mat select signal and the column select signal are activated and connect the pair of the first sub-middle I/O lines to the pair of the second sub-middle I/O lines when the mat select signal is activated and after the predetermined time from the activation of the column select signal, and wherein the switching unit is further configured to separate the pair of the first sub-middle I/O lines from the pair of the second sub-middle I/O lines when the mat select signal is deactivated.

7. The data I/O line control circuit of claim 1, wherein the switching unit is disposed in a sub hole region.

8. The data I/O line control circuit of claim 2, wherein the switching unit is further configured to separate the pair of the first sub-middle I/O lines from the pair of the second sub-middle I/O lines when the column select signal is activated and connect the pair of the first sub-middle I/O lines to the pair of the second sub-middle I/O lines after the predetermined time from the activation of the column select signal.

9. The data I/O line control circuit of claim 2, wherein the control unit is configured to deactivate the control signal after a predetermined time from an activation of a column address enable signal.

10. The data I/O line control circuit of claim 9, wherein the control unit is further configured to activate the control signal in response to an activation of the mat select signal and deactivate the control signal in response to the deactivation of the mat select signal.

11. The data I/O line control circuit of claim 10, wherein the control unit is further configured to output the control signal, which is activated in response to the activation of the mat select signal, deactivated after a first time in response to the activation of the column address enable signal, activated after a second time in response to the activation of the column select signal, and deactivated in response to the deactivation of the mat select signal.

12. The data I/O line control circuit of claim 9, wherein the switching unit is further configured to separate the pair of the first sub-middle I/O lines from the pair of the second sub-middle I/O lines when the column address enable signal is activated and connect the pair of the first sub-middle I/O lines to the pair of the second sub-middle I/O lines when the column select signal is activated.

13. The data I/O line control circuit of claim 2, wherein the switching unit comprises a MOS transistor that is configured to selectively separate the pair of the first sub-middle I/O lines from the pair of the second sub-middle I/O lines in response to the control signal.

14. A semiconductor integrated circuit comprising:
an I/O switching unit configured to transfer data loaded on a pair of local I/O lines to a pair of middle I/O lines;
a control unit configured to output a control signal after a predetermined time from an activation of a column select signal;
a switching unit coupled to the I/O switching unit and the control unit, the switching unit configured to selectively connect a pair of first sub-middle I/O lines to a pair of second sub-middle I/O lines in response to the control signal; and
a data bus sense amplifier coupled to the switching unit, the data bus sense amplifier configured to amplify the data loaded on the pair of the second sub-middle I/O lines and to transfer the data to a pair of global I/O lines, wherein the pair of the middle I/O lines is divided into the pair of the first sub-middle I/O lines, which is connected to the pair of the local I/O lines located at one side of the switching unit, and the pair of the second sub-middle I/O lines, which is connected to both the pair of the local I/O lines located at the other side of the switching unit and the data bus sense amplifier.

15. The semiconductor integrated circuit of claim 14, wherein the control unit is further configured to deactivate the control signal in response to the deactivation of a mat select signal.

16. The semiconductor integrated circuit of claim 15, wherein the control unit comprises:
a delay unit configured to delay the column select signal for the predetermined time;
a pulse generating unit configured to generate a pulse signal using the mat select signal; and
a latch unit coupled to both the delay unit and the pulse generating unit, the latch unit configured to latch an output signal of the delay unit and the pulse signal in order to produce the control signal.

17. The semiconductor integrated circuit of claim 15, wherein the switching unit, when the mat select signal is activated, is further configured to separate the pair of the first sub-middle I/O lines from the pair of the second sub-middle I/O lines in response to the activation of the column select signal and connect the pair of the first sub-middle I/O lines to the pair of the second sub-middle I/O lines after the predetermined time from the activation of the column select signal and wherein the switching unit separates the pair of the first sub-middle I/O lines from the pair of the second sub-middle I/O lines when the mat select signal is deactivated.

18. The semiconductor integrated circuit of claim 14, wherein the switching unit is further configured to separate the pair of the first sub-middle I/O lines from the pair of the second sub-middle I/O lines when the column select signal is activated and connect the pair of the first sub-middle I/O lines to the pair of the second sub-middle I/O lines after the predetermined time from the activation of the column select signal.

19. The semiconductor integrated circuit of claim 14, wherein the control unit is further configured to deactivate the control signal after a predetermined time from an activation of a column address enable signal.

20. The semiconductor integrated circuit of claim 19, wherein the control unit is further configured to enable in response to an activation of the mat select signal and disable in response to the deactivation of the mat select signal.

21. The semiconductor integrated circuit of claim 20, wherein the control unit is configured to output the control signal, which is always deactivated, when the data loaded on the pair of the local I/O lines, which are located at the other side of the switching unit, are read out.

22. The semiconductor integrated circuit of claim 21, wherein the control unit is further configured to output the control signal by receiving and latching both a delay signal of the column select signal and a delay signal of the column address enable signal.

23. The semiconductor integrated circuit of claim 22, wherein the control unit is further configured to output the control signal which is activated in response to the activation of the mat select signal, deactivated after a first time in response to the activation of the column address enable signal, activated after a second time in response to the activation of the column select signal, and deactivated in response to the deactivation of the mat select signal.

* * * * *